United States Patent
Lu et al.

(10) Patent No.: US 9,437,272 B1
(45) Date of Patent: Sep. 6, 2016

(54) MULTI-BIT SPIN TORQUE TRANSFER MAGNETORESISTIVE RANDOM ACCESS MEMORY WITH SUB-ARRAYS

(71) Applicant: QUALCOMM Incorporated, San Diego, CA (US)

(72) Inventors: Yu Lu, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/645,213

(22) Filed: Mar. 11, 2015

(51) Int. Cl.
*G11C 11/00* (2006.01)
*G11C 11/16* (2006.01)

(52) U.S. Cl.
CPC .......... *G11C 11/1673* (2013.01); *G11C 11/161* (2013.01); *G11C 11/1659* (2013.01)

(58) Field of Classification Search
CPC ............ G11C 11/1673; G11C 11/161; G11C 11/1659
See application file for complete search history.

(56) References Cited

U.S. PATENT DOCUMENTS

| | | | |
|---|---|---|---|
| 6,757,189 B2 | 6/2004 | Hung et al. | |
| 8,279,662 B2 | 10/2012 | Lou et al. | |
| 8,804,413 B2 | 8/2014 | Li et al. | |
| 2005/0213375 A1* | 9/2005 | Perner | G11C 11/16 365/158 |
| 2006/0039183 A1 | 2/2006 | Lin et al. | |
| 2006/0245227 A1* | 11/2006 | Nazarian | B82Y 10/00 365/46 |
| 2011/0235391 A1* | 9/2011 | Kim | G11C 8/10 365/148 |
| 2012/0241828 A1 | 9/2012 | Lee | |
| 2013/0094282 A1 | 4/2013 | Hu et al. | |
| 2013/0279244 A1 | 10/2013 | Kang et al. | |

* cited by examiner

*Primary Examiner* — Richard Elms
*Assistant Examiner* — Mohammed A Bashar
(74) *Attorney, Agent, or Firm* — Toler Law Group, PC

(57) ABSTRACT

A device includes a first magnetic tunnel junction (MTJ) element having a first read margin and a second MTJ element having a second read margin. The first read margin is greater than twice the second read margin. The device also includes an access transistor coupled between the first MTJ element and the second MTJ element. A gate of the access transistor is coupled to a word line. The first MTJ element, the second MTJ element, and the access transistor form a multi-bit spin torque transfer magnetoresistive random access memory (STT-MRAM) memory cell.

30 Claims, 7 Drawing Sheets

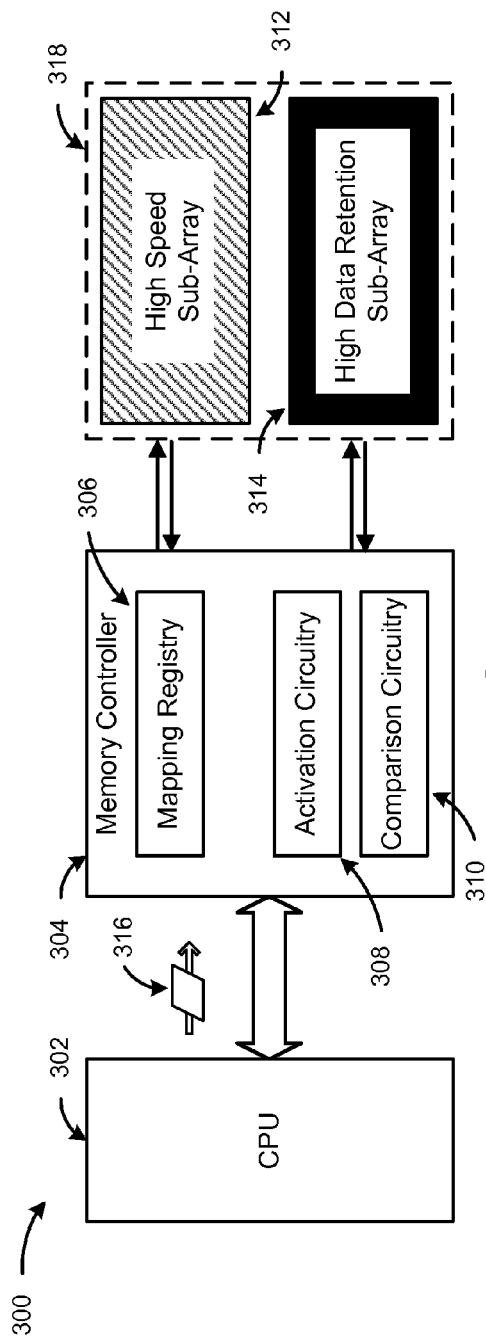
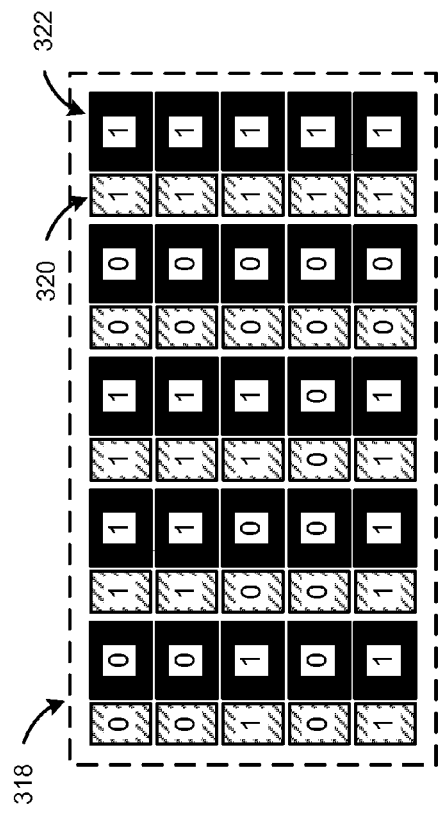

MULTI-BIT SPIN TORQUE TRANSFER MAGNETORESISTIVE RANDOM ACCESS MEMORY WITH SUB-ARRAYS

I. FIELD

The present disclosure is generally related to a multi-bit spin torque transfer magnetoresistive random access memory (STT-MRAM) with sub-arrays.

II. DESCRIPTION OF RELATED ART

Advances in technology have resulted in smaller and more powerful computing devices. For example, a variety of portable personal computing devices including wireless telephones, such as mobile and smart phones, tablets and laptop computers are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Electronic devices, such as mobile phones, may include separate types of memory arrays that each have a different use. For example, a mobile phone may have a separate memory array operating as a cache memory (e.g., static random access memory (SRAM)) for fast short-term data storage and another separate memory array operating as a main memory (e.g., dynamic random access memory (DRAM)) for long-term data storage and/or other separate memory arrays operating as off-chip non-volatile memory (NVM). Maintaining separate memory arrays having different types of memory uses may require added chip area and power usage.

III. SUMMARY

A multi-bit spin torque transfer magnetoresistive random access memory (STT-MRAM) may be configured for multiple memory applications (e.g., cache, main memory, or NVM) on electronic devices (e.g., a mobile phone). For example, magnetic tunnel junction (MTJ) elements of the multi-bit STT-MRAM cell may be configured to have different read margins and other distinguishing operating parameters that are tailored to a particular memory use. For example, a memory array of multi-bit STT-MRAM cells may include sub-arrays of MTJ elements, each sub-array configured for a particular memory use.

In a particular aspect, a device includes a first MTJ element having a first read margin. The device also includes a second MTJ element having a second read margin. The first read margin is greater than twice the second read margin. The device also includes an access transistor coupled between the first MTJ element and the second MTJ element. The access transistor has a gate that is coupled to a word line. The first MTJ element, the second MTJ element, and the access transistor form a multi-bit STT-MRAM memory cell.

In another particular aspect, a method of operation of a device that includes an access transistor, a first MTJ element, and a second MTJ element includes activating the access transistor. The first MTJ element and the second MTJ element are responsive to the access transistor. The first MTJ element has a first size and the second MTJ element has a second size that is greater than twice the first size. The method also includes determining a resistive state of the second MTJ element by performing a first comparison of a sensed value to a first reference value and performing a second comparison of the sensed value to a second reference value. The second reference value is based on a result of the first comparison.

In another particular aspect, an apparatus includes first means for storing a first magnetic state. The first means for storing has a first size. The apparatus also includes second means for storing a second magnetic state. The second means for storing has a second size that is greater than twice the first size. The apparatus also includes means for coupling the first means for storing and the second means for storing. The means for coupling is coupled to a word line. The first means for storing, the second means for storing, and the means for coupling form a multi-bit STT-MRAM memory cell.

In another particular aspect, an apparatus includes a first MTJ sub-array formed by a plurality of first MTJ elements of a memory array. The apparatus also includes a second MTJ sub-array formed by a plurality of second MTJ elements of the memory array. The first MTJ sub-array is configured to operate based on a first set of parameters for a first memory use and the second MTJ sub-array is configured to operate based on a second set of parameters for a second memory use that is different from the first memory use.

One particular advantage provided by at least one of the disclosed aspects is the reduction of chip size and power consumption as compared to using separate memory arrays for separate memory uses. A multi-bit STT-MRAM memory cell may include sub-arrays with distinguishing operating parameters tailored to particular memory uses. An array of memory cells may include sub-arrays within the array, the sub-arrays each having a particular memory use. Use of a single memory array having memory sub-arrays with particular memory uses may consume less chip area and utilize less power for data access and storage operations than use of multiple separate memory devices.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

FIG. 3A is a block diagram that illustrates a system having memory sub-arrays;

FIG. 3B is a block diagram that illustrates a memory array having sub-arrays.

V. DETAILED DESCRIPTION

Figure 1:
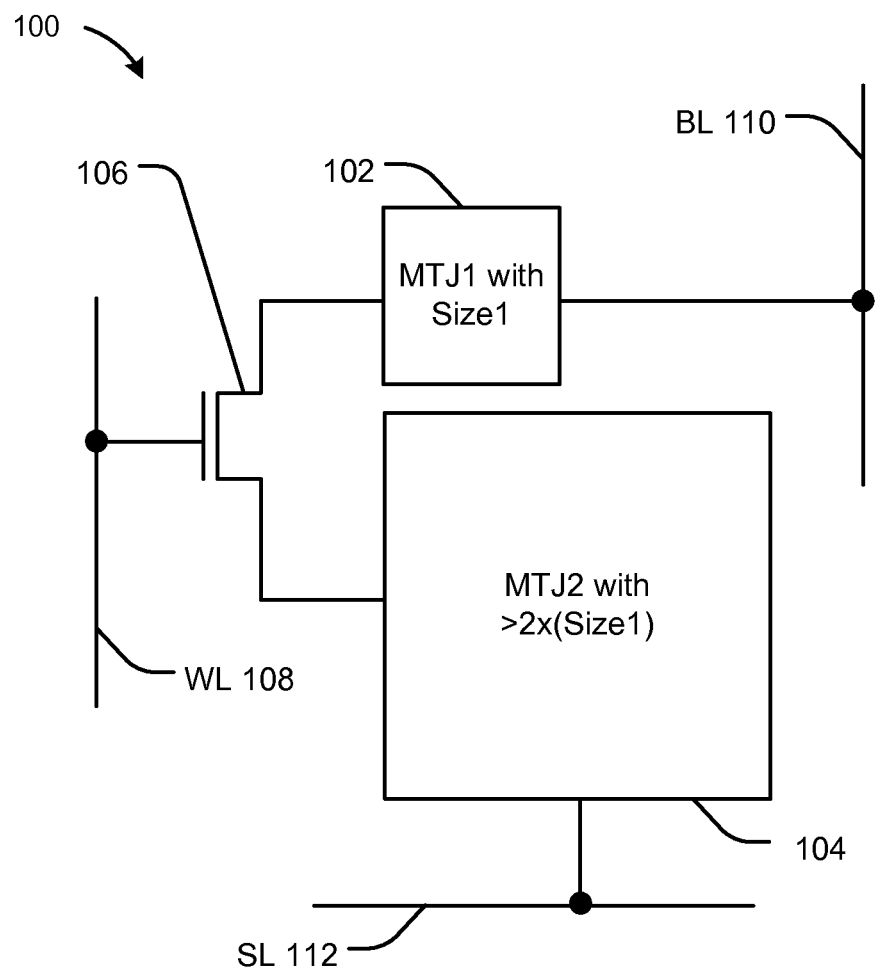
FIG. 1 is a block diagram that illustrates a particular aspect of a device.

Referring to FIG. 1, a particular illustrative aspect of a device 100 is shown. The device 100 may be a multi-bit spin torque transfer magnetoresistive random access memory (STT-MRAM) memory cell. The device 100 may be integrated within a die (e.g., a semiconductor die).

The device 100 includes a first magnetic tunnel junction (MTJ) element 102, a second MTJ element 104, a word line (WL) 108, a bit line (BL) 110, a source line (SL) 112, and an access transistor 106. The first MTJ element 102 is coupled to the bit line 110 and the second MTJ element 104 is coupled to the source line 112.

The first MTJ element 102 may have a first read margin (AR) that is greater than twice a second read margin of the second MTJ element 104. For example, sizes of the first and second MTJ elements 102, 104 may be associated with particular read margins. Based on the difference in sizes of the MTJ elements 102, 104, the MTJ elements 102, 104 may have operating parameters or characteristics (e.g., read margin, read/write speed, data retention) that are different from each other. For example, the second MTJ element 104 may have a size that is greater than twice the size of the first MTJ element 102. The difference in sizes of the MTJ elements 102, 104 may cause the first MTJ element 102 to have a first read margin that is greater than twice a second read margin of the second MTJ element 104.

As used herein, "size" of an MTJ element relative to another MTJ element may refer to one or more dimensions of the MTJ element such that the MTJ element has a read margin that is greater than the read margin of the other MTJ element. For example, the second MTJ element 104 may have a length that is greater than twice the length of the first MTJ element 102, a height that is greater than twice the height of the first MTJ element 102, a width that is greater than twice the width of the first MTJ element 102, or a combination thereof. In each of the above examples, the size of the second MTJ element 104 is greater than the size of the first MTJ element 102 and the read margin of the second MTJ element 104 is greater than twice the read margin of the first MTJ element 102.

The access transistor 106 may be an n-type metal-oxide-semiconductor (NMOS) transistor coupled in series between the first MTJ element 102 and the second MTJ element 104. Alternatively, the access transistor 106 may be a p-type metal-oxide-semiconductor (PMOS) transistor. The access transistor 106 may include a gate coupled to the word line 108. The access transistor 106 may be activated by a word line signal from the word line 108 that is applied to the gate of the access transistor 106. In response to the word line signal from the word line 108, the access transistor 106 may be configured to selectively couple the first MTJ element 102 to the second MTJ element 104 for read or write operations. When a particular read current (or particular write current) associated with the first MTJ element 102 is passed through the bit line 110 or the source line 112, a read (or write) operation may be performed at the first MTJ element 102. When a particular read current (or particular write current) associated with the second MTJ element 104 is passed through the bit line 110 or the source line 112, a read (or write) operation may be performed at the second MTJ element 104.

The first MTJ element 102, the second MTJ element 104, and the access transistor 106 may form a multi-bit STT-MRAM memory cell in which data may be stored in the form of resistive states (e.g., logic states) of the first and second MTJ elements 102, 104. For example, the access transistor 106 may be configured to couple the first MTJ element 102 and the second MTJ element 104 to provide a 2-bit STT-MRAM memory cell having four possible resistive states that correspond to four logic states (e.g., the logic states "00", "01", "10", and "11").

While the access transistor 106 is activated via a word line signal applied at the word line 108, a change from one resistive state to another resistive state may occur. For example, by applying a particular write current (e.g., a write current having a threshold magnitude) corresponding to the first MTJ element 102 at the bit line 110 or at the source line 112 to induce a change in magnetic polarity of the first MTJ element 102, a change in the resistive state of the first MTJ element 102 may occur. By applying a second particular write current (e.g., a write current having a threshold magnitude) corresponding to the second MTJ element 104 at the bit line 110 or at the source line 112 to induce a change in magnetic polarity of the second MTJ element 104, a change in the resistive state of the second MTJ element 104 may occur.

The first MTJ element 102 and the second MTJ element 104 may each be configured to have different operating parameters. For example, the threshold current for changing the magnetic polarity of an MTJ element may be positively dependent on the size (e.g., one or more dimensions) of the MTJ element. Because the second MTJ element 104 has a size that is greater than twice the size of the first MTJ element 102, the threshold current for changing the magnetic polarity of the second MTJ element 104 may be larger than the threshold current for changing the magnetic polarity of the first MTJ element 102.

Based on the difference in size, the first and second MTJ elements 102, 104 may have other operating parameters or characteristics that are different from each other. For example, the second MTJ element 104 may have a data retention parameter (e.g., an energy barrier (Eb)) that is greater than the data retention parameter of the first MTJ element 102. In this example, the greater data retention parameter of the second MTJ element 104 provides a data retention time of the second MTJ element 104 that is longer than the data retention time of the first MTJ element 102.

The differing operating parameters or characteristics of the first and second MTJ elements 102, 104 may enable the first and second MTJ elements 102, 104 to be customized for different memory uses. For example, the second MTJ element 104, having greater data retention than the first MTJ element 102, may retain data for a longer time duration than the first MTJ element 102 and is configured to operate as a long term data storage element. As another example, the first MTJ element 102, having a larger read margin (AR) than the second MTJ element 104, may provide shorter read/write durations and is configured to operate as a fast access storage element.

In addition to size, the first and second MTJ elements 102, 104 may employ other configurations separately or in combination to achieve differing operating parameters or characteristics described above. For example, the first MTJ element 102 may include different materials than the second MTJ element 104. As another example, the first and second MTJ elements 102, 104 may have different physical arrangements (e.g., arrangements that may be planar or multi-dimensional).

The first MTJ element 102 and the second MTJ element 104 may each include a "fixed layer" and a "free layer." Particular magnetic orientations of the free layer with respect to the fixed layer result in parallel or anti-parallel states of an MTJ element. Particular combinations of the parallel and the anti-parallel states of the first and second MTJ elements 102, 104 may correspond to particular resistive states (e.g., resistive states that represent the four logic states "00", "01", "10", and "11").

During operation, data may be stored to either the first MTJ element 102 or the second MTJ element 104 by applying a particular write current at the bit line 110 or the source line 112 to induce a change in the magnetic polarity of the first or the second MTJ elements 102, 104 while the access transistor 106 is activated via a word line signal applied at the word line 108. For example, when storing data to the first MTJ element 102, a particular write current (e.g., a current that exceeds the threshold current associated with the first MTJ element 102) may flow through the bit line 110, the first and the second MTJ elements 102, 104, and the source line 112 to change the magnetic polarity of the first MTJ element 102. Based on the size of the first MTJ element 102, the particular write current for writing the first MTJ element 102 may be smaller than a second particular write current (e.g., a current that exceeds the threshold current associated with the second MTJ element 104) needed to change the magnetic polarity of the second MTJ element 104. When writing to the first MTJ element 102, the smaller write current for writing data to the first MTJ element 102 does not alter the resistive state (e.g., logic state) of the second MTJ element 104.

Because the first and second MTJ elements 102, 104 have different sizes or different characteristics, writing to the second MTJ element 104 may require a larger write current than the current used for writing to the first MTJ element 102. The larger write current used to write to the second MTJ element 104 may change the resistive state (e.g., disturb the logic state) of the first MTJ element 102. To account for the possible "disturb" of the first MTJ element 102, storing data to the second MTJ element 104 (e.g., a write operation to the second MTJ element 104) may include initiating a "read with write-back" process prior to writing to the second MTJ element 104. For example, prior to writing to the second MTJ element 104, a read operation of the first MTJ element 102 may be performed to read a value of the first MTJ element 102 (e.g., the read value may be stored at a memory controller or at another storage area accessible to the memory controller). After writing to the second MTJ element 104, the resistive state (e.g., logic state) of the first MTJ element 102 that may have been disturbed, may be restored by writing back the previously read value to the first MTJ element 102 (e.g., a "write-back" operation controlled by the memory controller).

Data may be read from the first MTJ element 102 by applying a particular read current through the bit line 110 or the source line 112 and sensing a current value associated with the first MTJ element 102. By comparing the sensed current value to a particular reference level associated with the first MTJ element 102, a particular resistive state (e.g., logic state) of the first MTJ element 102 may be determined. For example, when reading the first MTJ element 102, a particular read current associated with the first MTJ element 102 may be passed through the bit line 110, the first and second MTJ elements 102, 104, and the source line 112. A current value of the first MTJ element 102 may be sensed (e.g., by sense amplifiers or other sensing circuitry peripheral to the first MTJ element 102). The sensed value may be compared to a particular reference value associated with the first MTJ element 102 to determine a resistive state (e.g., logic state) of the first MTJ element 102. In this case, the first MTJ element 102 is read and the second MTJ element 104 is unread.

A change in the resistive state (e.g., logic state) associated with the first MTJ element 102 may correspond to a logic state change. In an illustrative non-limiting example, a change in a resistive state of the first MTJ element 102 may correspond to a logic state change from "01" to "11" or from "00" to "10" or vice versa (i.e., the resistive state of the first MTJ element 102 may indicate a most significant bit (MSB) of a bit sequence). In another illustrative non-limiting example, a change in a resistive state of the first MTJ element 102 may correspond to a logic state change from "00" to "01" or from "10" to "11" or vice versa (i.e., the resistive state of the first MTJ element 102 may indicate a least significant bit (LSB) of a bit sequence). Determining a resistive state for the first MTJ element 102 may employ one or more comparison devices (e.g., one or more comparators or sense amplifiers) to compare the sensed value associated with the first MTJ element 102 to a reference level associated with the first MTJ element 102.

In a particular aspect, data may be read from the second MTJ element 104 by applying a particular read current through the bit line 110 or the source line 112 and sensing a current value associated with the second MTJ element 104. The particular read current used to read the second MTJ element 104 may be larger than the read current used to read the first MTJ element 102. Reading the second MTJ element 104 may utilize a dual-comparison method to determine the resistive state (e.g., logic state) of the second MTJ element 104. By comparing the sensed current value of the second MTJ element 104 to a particular reference level associated with the second MTJ element 104, a particular resistive state (e.g., logic state) of the second MTJ element 104 may be determined.

For example, a particular read current associated with the second MTJ element 104 may be passed through the bit line 110, the first and second MTJ elements 102, 104, and the source line 112. A current value of the second MTJ element 104 may be sensed, and the sensed current value may be used as part of a first comparison with a first reference value associated with the second MTJ element 104. A result of the first comparison may indicate possible resistive states of the second MTJ element 104. Based on the result of the first comparison, the sensed current value may be used as part of a second comparison with a second reference value associated with the second MTJ element 104 to determine a resistive state (e.g., logic state) of the second MTJ element 104 from the possible resistive states indicated by the first comparison. Changes in resistive states (e.g., logic states) associated with the second MTJ element 104 may correspond to logic state changes. In an illustrative non-limiting example, a change in a resistive state of the second MTJ element 104 may correspond to a logic state change from "00" to "01", or a change from "10" to "11".

Determining a resistive state for the second MTJ element 104 may employ a dual comparison operation that may use at least two different reference level values associated with the second MTJ element 104. The second reference level value may be greater than the first reference level value. In determining a resistive state of the second MTJ element 104, the dual comparison operation may employ other "options"

that use combinations of the two reference level values associated with the second MTJ element 104 and one reference level value associated with the first MTJ element 102, as described with reference to FIGS. 5A, 5B, 5C, and 5D.

The reference level values associated with the first and second MTJ elements 102, 104 may be stored peripherally to the device 100 (e.g. stored at a memory controller peripheral to the device 100). In another aspect, the reference level values may be derived from average reference level values determined from an "initialization" device (e.g., a particular test device 100). Alternatively, the reference level may be determined by other memory cells or other MTJ structures (not shown).

Read and write operations of the first and second MTJ elements 102, 104 may be performed by circuitry (not shown) that may be peripheral to the first and second MTJ elements 102, 104. For example, peripheral circuitry may include, but is not limited to, any number of memory controllers, decoders, sense amplifiers, registers, or other devices that may be used for read and write operations of memory elements. For example, the sensing operations of the first and second MTJ elements 102, 104 may be performed by sense amplifiers or other devices capable of sensing current values of MTJ elements. Comparison operations of the first and second MTJ elements 102, 104 may be performed by one or more devices (e.g., comparators peripheral to the first and second MTJ elements 102, 104) capable of comparing a sensed value to a reference value associated with the MTJ elements 102, 104. In a non-limiting example, comparison operations associated with the first and second MTJ elements 102, 104 may be performed by one or more sense amplifiers configured to perform both sensing operations and comparison operations.

By configuring the second MTJ element 104 to have a size that is greater than twice the size of the first MTJ element 102, first and second MTJ elements may have different operating parameters that are conducive to different memory uses. A dual memory use memory array formed by a plurality of dual memory use devices (e.g., the device 100) may be provided, as described with reference to FIG. 2.

Figure 2:
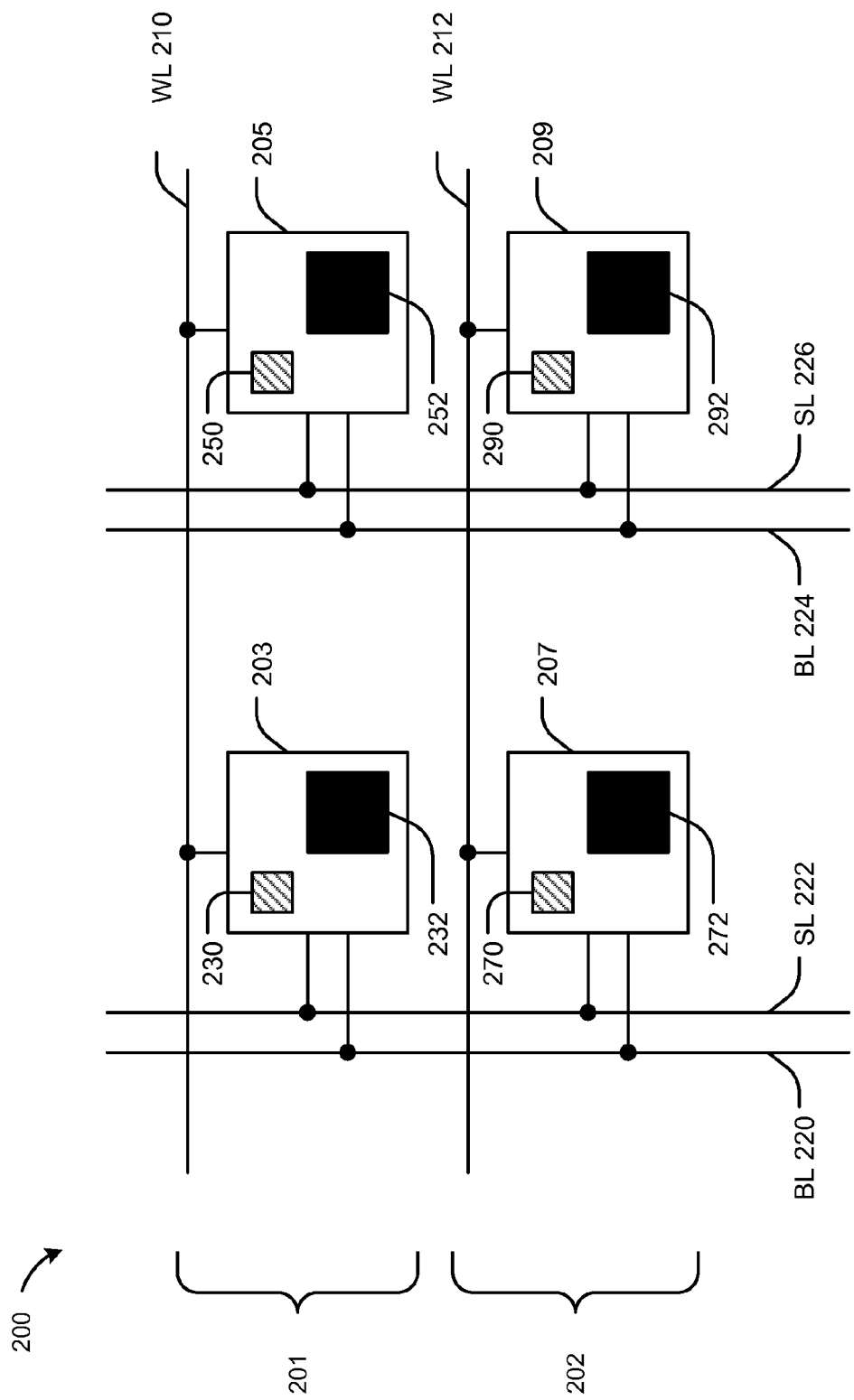
FIG. 2 is a block diagram depicting a portion of a memory array.

Referring to FIG. 2, details of a portion of a memory array are shown and generally designated 200. The memory array may include one or more memory devices (e.g., memory devices 203, 205, 207, and 209). The memory devices 203, 205, 207, and 209 may each correspond to the device 100 of FIG. 1. For example, the memory devices 203, 205, 207, and 209 may each correspond to a multi-bit STT-MRAM memory cell.

A first row 201 of the memory array may include the memory device 205. The memory device 205 may share a word line (WL) 210 with other memory devices (e.g., the memory device 203) of the first row 201 of the memory array. The memory device 205 may also share a bit line (BL) 224 and a source line (SL) 226 with other memory devices (e.g., the memory device 209) of a column of memory devices of the memory array. A second row 202 of the memory array may include the memory device 209. The memory device 209 may share a word line 212 with other memory devices (e.g., the memory device 207) of the second row 202 of the memory array. The memory device 207 may also share a bit line 220 and a source line 222 with other memory devices (e.g., the memory device 203) of a column of memory devices of the memory array. Structure and operation of any of the word lines 210, 212, the bit lines 220, 224, and the source lines 222, 226 may be as described with reference to the word line 108, the bit line 110 and the source line 112 of FIG. 1 with a respective word line to word line, bit line to bit line, and source line to source line correspondence.

Each of the memory devices 203, 205, 207, and 209 may include a respective first MTJ element and second MTJ element that are included in first and second MTJ sub-arrays of the memory array. For example, a plurality of first MTJ elements 230, 250, 270, and 290 (e.g., striped boxes) of the memory devices 203, 205, 207, and 209 may each have approximately a first size and may form a portion of a first MTJ sub-array of the memory array. First MTJ elements 230, 250, 270, and 290 may each correspond to the first MTJ element 102 of FIG. 1. A plurality of second MTJ elements 232, 252, 272, and 292 (e.g., solid black boxes) of the memory devices 203, 205, 207, and 209 may each have approximately a second size that is greater than twice the first size and may form a portion of a second MTJ sub-array of the memory array. Second MTJ elements 232, 252, 272, and 292 may each correspond to the second MTJ element 104 of FIG. 1. The plurality of first MTJ elements and the first MTJ sub-array may have operating parameters associated with the first size. The plurality of second MTJ elements and the second MTJ sub-array may have operating parameters associated with the second size.

Based on the operating parameters of the first and second MTJ sub-arrays, the first and second MTJ sub-arrays may be configured for particular memory uses. For example, a particular read margin (AR) parameter associated with the first MTJ sub-array may provide shorter read/write durations that enables the first MTJ sub-array to operate as a fast/frequent access array. As another example, a data retention parameter associated with the second MTJ sub-array may provide longer data retention durations that enables the second MTJ sub-array to operate as a long term storage array. Operating as a long term storage array, the second MTJ sub-array may be used for long term data storage (e.g., redundancy/trimming data for packaging uses) or long term code storage (e.g., boot code storage). As a long term storage array, the second MTJ sub-array may utilize less error checking and correction (ECC) or have fewer data redundancy needs than the first MTJ sub-array.

The first MTJ sub-array and the second MTJ sub-array may accommodate other memory uses. For example, when configured as a fast access array, the first MTJ sub-array may be used as a data cache (e.g., a level 1 cache). When configured as a long term storage array, the second MTJ sub-array may be used as a temporary storage array for the first MTJ sub-array. The second MTJ sub-array may also be used to store data that is used as part of a sleep-mode operation of an electronic device or data used as part of an initialization operation (e.g., data to initialize a cache array state or processor state) of the electronic device.

During operation, a write operation may be performed at one or more memory devices of a selected row of memory devices. The write operation may include writing to a first or second MTJ element of the one or more memory devices of the selected row. For example, a signal (e.g., voltage) may be provided at the word line 210 that indicates a write request corresponding to the memory devices (e.g., the memory devices 203 and 205) of the first row 201 of the memory array. The signal provided at the word line 210 may activate a gate of an access transistor (not shown) of each of the memory devices (e.g., the memory devices 203 and 205) of the first row 201. As an example of writing to the memory device 205, a data value may be stored at the first MTJ element 250 of the memory device 205 by providing a particular write current for writing to the first MTJ element 250. The particular write current may pass through the bit line 224, the first and second MTJ elements 250, 252, and the source line 226. The particular write current for writing to the first MTJ element 250 may be smaller than a write current for writing to the second MTJ element 252.

As an example of writing to the memory device 203, a data value may be stored at the second MTJ element 232 of the memory device 203 by providing the write current for writing the second MTJ element 232 to pass through the bit line 220, the first and second MTJ elements 230, 232, and the source line 222. The write current for writing the second MTJ element 232 may be large enough to write to both the first and second MTJ elements 230, 232 and may "disturb" the value stored at the first MTJ element 230. Thus, prior to writing to the second MTJ element 232, a read operation may be performed at the first MTJ element 230. After writing to the second MTJ element 232, the resistive state (e.g., logic state) of the first MTJ element 230 that was previously read may be restored (e.g., by re-writing the value to the first MTJ element 230 to compensate for disturb effects caused by writing to the second MTJ element 232).

A read operation may be performed at one or more memory devices of a selected row of memory devices. The read operation may include reading from a first or second MTJ element of the one or more memory devices of the selected row. For example, a signal (e.g., a voltage) may be provided at the word line 212 that may indicate a read request corresponding to the memory devices (e.g., the memory devices 207 and 209) of the second row 202 of the memory array. The signal provided at the word line 212 may activate a gate of an access transistor (not shown) of each of the memory devices (e.g., the memory devices 207 and 209) of the second row 202.

As an example of reading from the memory device 209, a data value stored at the first MTJ element 290 of the memory device 209 may be read by providing a read current associated with the first MTJ element 290 to pass through the bit line 224, the first and second MTJ elements 290, 292, and the source line 226. A current value of the first MTJ element 290 may be sensed, and the current value may be used as part of a comparison with a reference value associated with the first MTJ element 290. Based on the comparison, a resistive state (e.g., a logic state) of the first MTJ element 290 may be determined. The read current associated with the first MTJ element 290 may be smaller than a read current utilized to read the second MTJ element 292.

As an example of reading from the memory device 207, a data value stored at the second MTJ element 272 of the memory device 207 may be read by providing a read current associated with the second MTJ element 272 that passes through the bit line 220, the first and second MTJ elements 270, 272, and the source line 222. The read current associated with the second MTJ element 272 may be larger than a read current utilized to read the first MTJ element 270. A current value of the second MTJ element 272 may be sensed, and the current value may be compared (first comparison) with a first reference value associated with the second MTJ element 272. Based on a result of the first comparison, the sensed current value may be compared (second comparison) with a second reference value associated with the second MTJ element 272 to determine a resistive state (e.g., a logic state) of the second MTJ element 272.

Read and write operations of the first and second MTJ sub-arrays may be performed by circuitry (not shown) that may be peripheral to the memory array. For example, peripheral circuitry may include, but is not limited to, any number of memory controllers, decoders, sense amplifiers, registers, or other devices that may be used for read/write operations of memory elements. For example, the sensing operations of the one or more memory devices (e.g., memory devices 203, 205, 207, and 209) of the first and second MTJ sub-arrays may be performed by sense amplifiers or other devices capable of sensing current values of the plurality of first and second MTJ elements of the first and second MTJ sub-arrays. Comparison operations of the one or more memory devices may be performed by comparators or other devices capable of comparing a sensed value to a reference value associated with the plurality of first and second MTJ elements of the first and second MTJ sub-arrays.

First and second MTJ elements may be configured to have different operating parameters conducive to particular memory uses. By selecting the first and second MTJ elements to form first and second MTJ sub-arrays, a single memory array may include multiple MTJ sub-arrays, each sub-array with different operating parameters conducive to particular memory uses (e.g., a fast access array or a long term storage array), resulting in dual (or multiple) memory use within the single memory array. As an example, the single memory array may accommodate the memory uses of high speed data storage and long term high data retention storage, as described with respect to FIGS. 3A and 3B.

Referring to FIG. 3A, a block diagram that illustrates a system having memory sub-arrays is shown and generally designated 300. The system 300 includes a single memory array 318. The memory array 318 includes a plurality of first MTJ elements (e.g., the first MTJ elements 230, 250, 270, and 290 of FIG. 2) that are configured to form a first MTJ sub-array (e.g., a high speed (HS) sub-array) 312. The memory array 318 also includes a plurality of second MTJ elements (e.g., the second MTJ elements 232, 252, 272, and 292 of FIG. 2) that form a second MTJ sub-array (e.g., a high data retention (HDR) sub-array) 314. The first and second MTJ sub-arrays may be integrated within a die (e.g., a semiconductor die).

The first MTJ sub-array may be configured to have a first set of operating parameters for a first memory use (e.g., as a fast/frequent access array or as a data cache) and the second MTJ sub-array may be configured to have a second set of operating parameters for a second memory use (e.g., as a long term storage array) that is different from the first memory use. The first set of operating parameters may be different from the second set of operating parameters. The first set of operating parameters may be based on physical characteristics of each first MTJ element of the plurality of first MTJ elements. The second set of operating parameters may be based on physical characteristics of each second MTJ element of the plurality of second MTJ elements. For example, a physical characteristic of the first MTJ elements may include a first size and a physical characteristic of the second MTJ elements may include a second size that is greater than twice the first size.

Other physical characteristics of the first MTJ elements and the second MTJ elements may serve as a basis for the different operating parameters of the first and second MTJ sub-arrays. For example, the first MTJ elements may have materials of a first material type and the second MTJ elements may have materials of a second material type that is different from the first material type. As another example, first and second MTJ elements of the first and second MTJ sub-arrays may be configured to have different physical arrangements (e.g., arrangements that may be planar or multi-dimensional).

The HS sub-array 312 and the HDR sub-array 314 may each have operating parameters conducive to a particular memory use. For example, the operating parameters associated with the plurality of second MTJ elements (e.g., high data retention) may be associated with the HDR sub-array 314. The operating parameters associated with the plurality of first MTJ elements (e.g., a larger read margin for shorter read/write durations) may be associated with the HS sub-array 312. As an example, the HDR sub-array 314 may have a data retention time that is longer than the data retention time of the HS sub-array 312. As another example, the HS sub-array 312 may have a read/write time duration that is shorter (e.g., fast read/write time duration) than the read/write time duration of the HDR sub-array 314. The HS and HDR sub-arrays 312, 314 may be integrated within a device, such as a mobile phone, a tablet, a set top box, a music player, a video player, an entertainment unit, a navigation device, a communications device, a personal digital assistant (PDA), a fixed location data unit, or a computer, as illustrative examples.

The system 300 further includes a memory controller 304 and a central processing unit (CPU) 302. The memory controller 304 may be configured to address each of the plurality of first MTJ elements of the first MTJ sub-array (e.g., the HS sub-array 312) and each of the plurality of second MTJ elements of the second MTJ sub-array (e.g., the HDR sub-array 314). The memory controller 304 may be configured to store data to a particular MTJ sub-array (e.g., the HS sub-array 312 or the HDR sub-array 314) based on a priority indicator associated with the data that is received by the memory controller 304.

The HS sub-array 312 and the HDR sub-array 314 may be part of a single memory array 318 (e.g., the memory array 200 of FIG. 2). The HS sub-array 312 and the HDR sub-array 314 are each coupled to and in communication with the memory controller 304. The memory controller 304 may be coupled to and is in communication with the CPU 302. The memory controller 304 may receive data read/write requests and instructions associated with the requests from the CPU 302. The memory controller 304 may also receive a priority indicator 316 from the CPU 302 that indicates a priority level associated with data that is to be read/written to either the HS sub-array 312 or the HDR sub-array 314 of the single memory array 318.

The memory controller 304 may include a mapping registry 306 that is utilized as part of processing data read/write requests from the CPU 302. The mapping registry 306 may include data parameters (e.g., data identifier, CPU logical addressing, memory physical addressing, data priority level, sub-array allocation) that are utilized by the memory controller 304 to read/write data to particular MTJ sub-arrays based on the priority level of the data and to map the data stored at the particular MTJ sub-arrays to the data requests from the CPU 302.

The storage of data to a particular MTJ sub-array may be determined by the memory controller 304 based on other indicators from the CPU 302. For example, data allocation to a particular MTJ sub-array may be based on a data access indicator that may indicate access frequency of the data (e.g., data that is accessed often). In another example, data allocation to a particular MTJ sub-array may be based on a data usage indicator that may indicate a particular use of the data (e.g., data used for processor cache operations or data used for boot code operations).

The memory controller 304 may include activation circuitry 308 for activating the HS and HDR sub-arrays 312, 314 as a part of read/write operations processed by the memory controller 304. The activation circuitry 308 may provide signals for the activation of access transistors (not shown) associated with the plurality of first and second MTJ elements that form the HS and HDR sub-arrays 312, 314. In a particular example, the activation circuitry 308 may be a part of circuitry peripheral to the HS and HDR sub-arrays 312, 314. For example, peripheral circuitry may include, but is not limited to, other memory controllers, decoders, sense amplifiers, registers, or other devices that may be used for read/write operations of memory elements of a memory array.

The memory controller 304 may include comparison circuitry 310 for performing comparisons of sensed values to particular reference values as a part of read/write operations processed by the memory controller 304. For example, as part of a read operation of a particular first MTJ element of the HS sub-array 312, the comparison circuitry 310 may compare a sensed value of the particular first MTJ element to a particular reference value associated with the first MTJ element in order to determine a resistive state (e.g., a logic state) of the particular first MTJ element.

The comparison circuitry 310 may also perform a dual-comparison method to determine a resistive state (e.g., a logic state) of a particular second MTJ element of the HDR sub-array 314. For example, as part of a read operation of the particular second MTJ element of the HDR sub-array 314, the comparison circuitry 310 may perform a first comparison of a sensed value of the particular second MTJ element to a particular reference value associated with the second MTJ element in order to determine a resistive state (e.g., a logic state) of the particular second MTJ element. Based on a result of the first comparison, the comparison circuitry 310 may perform a second comparison of the sensed value to a second reference value associated with the second MTJ element to determine the resistive state (e.g., the logic state) of the second MTJ element. In a particular aspect, the comparison circuitry 310 may be a part of circuitry peripheral to the HS and HDR sub-arrays 312, 314. For example, peripheral circuitry may include, but is not limited to, other memory controllers, decoders, sense amplifiers, registers, or other devices that may be used for read/write operations of memory elements of a memory array.

During operation, the memory controller 304 may receive, from the CPU 302, data read and write requests and associated priority indicators that indicate a priority level for data associated with the requests. The memory controller 304 may read and write the data to either the HS or HDR sub-arrays 312, 314 based on the priority level of the data. For example, the CPU 302 may provide a priority indicator 316 as part of a write request that indicates that particular data is to be stored to a memory array (e.g., the HS sub-array 312 of the memory array 318) that is configured for fast data access or for temporary data storage. The memory controller 304 may utilize the mapping registry 306 as part of processing the write request and the priority indicator received from the CPU 302. Based on the priority indicator 316, the memory controller 304 may determine that the particular data is to be stored to the HS sub-array 312 and not to the HDR sub-array 314. The memory controller 304 may utilize the activation circuitry 308 to activate the HS sub-array 312 and may perform the write operation of the particular data to the HS sub-array 312.

As another example, the memory controller 304 may receive a read request from the CPU 302 to retrieve the particular data. The memory controller 304 may utilize the mapping registry 306 as part of processing the read request received from the CPU 302. Upon determining that the HS sub-array 312 is to be read, the memory controller 304 may utilize the activation circuitry 308 to activate the HS sub-array 312 and may utilize the comparison circuitry 310 to perform a comparison of a sensed value associated with a first MTJ element of the HS sub-array 312 where the particular data is stored. In certain aspects, the mapping registry 306, the activation circuitry 308, and the comparison circuitry 310 may be separate from the memory controller 304. Based on a result of the comparison, the comparison circuitry 310 may determine a resistive state (e.g., a logic state) of the first MTJ element of the HS sub-array 312, where the particular data is stored, and may complete the read operation to fulfill the read request.

In cases when the particular data is to be read from the HDR sub-array 314, the memory controller 304 may utilize the comparison circuitry 310 to perform the dual-comparison method to determine a resistive state (e.g., a logic state) of a second MTJ element of the HDR sub-array 314 where the particular data is stored. In certain aspects, the memory controller 304 may utilize separate activation circuitry 308 and comparison circuitry 310 for reading from the HDR sub-array 314 and may utilize separate activation circuitry 308 and comparison circuitry 310 for reading from the HS sub-array 312. In certain aspects, the activation circuitry 308, and the comparison circuitry 310 may be separate from the memory controller 304.

For example, the comparison circuitry 310 may perform a first comparison of a sensed value associated with the second MTJ element of the HDR sub-array 314 to a reference value associated with the second MTJ element of the HDR sub-array 314. Based on a result of the first comparison, the comparison circuitry 310 may perform a second comparison of the sensed value to a reference value associated with the second MTJ element of the HDR sub-array 314. Based on the second comparison, the comparison circuitry 310 may determine a resistive state (e.g., logic state) of the second MTJ element of the HDR sub-array 314 and may complete the read operation to fulfill the read request.

The HS sub-array 312 and the HDR sub-array 314, formed by the plurality of first and second MTJ elements respectively, may accommodate different memory uses. In a non-limiting example, the HDR sub-array 314 may be used as a backup storage array for the HS sub-array 312, as further described with reference to FIG. 3B.

FIG. 3B illustrates an example of the memory array 318 of FIG. 3A. A representative first MTJ element 320 may have a first size and may be part of a plurality of first MTJ elements having approximately the first size (e.g., striped boxes). A representative second MTJ element 322 may have a second size that is greater than twice the first size and may be part of a plurality of second MTJ elements (e.g., solid black boxes). The plurality of first MTJ elements and the plurality of second MTJ elements form respective first and second MTJ sub-arrays that may each be configured to operate, based on respective first and second sets of parameters, for a particular memory use. In a non-limiting example, the second MTJ sub-array (e.g., the high data retention sub-array 314 of FIG. 3A) may be configured to store data values that are duplicate values of corresponding data that is stored in the first MTJ sub-array (e.g., the high speed sub-array 312 of FIG. 3A). Thus, the second MTJ sub-array may be configured to operate as backup storage for the first MTJ sub-array.

For example, the first MTJ element 320 may store a data value that corresponds to a logic value of "1". The second MTJ element 322 may store a data value corresponding to a logic value of "1" that is a duplicate data value of the data value stored at the particular first MTJ element 320. In a similar way, the logical data value in each first MTJ element of the plurality of first MTJ elements is duplicated in each of the corresponding second MTJ elements of the plurality of second MTJ elements.

The first and second MTJ sub-arrays of the memory array 318 may utilize the read and write operations utilized by the device 100 of FIG. 1 or the devices of the memory array 200 of FIG. 2. Read operations associated with the second MTJ sub-array of the memory array 318 may utilize a dual-comparison method to determine the resistive states (e.g., the logic states) of the second MTJ elements that form the second MTJ sub-array, as further described with reference to FIG. 4.

Figure 4:
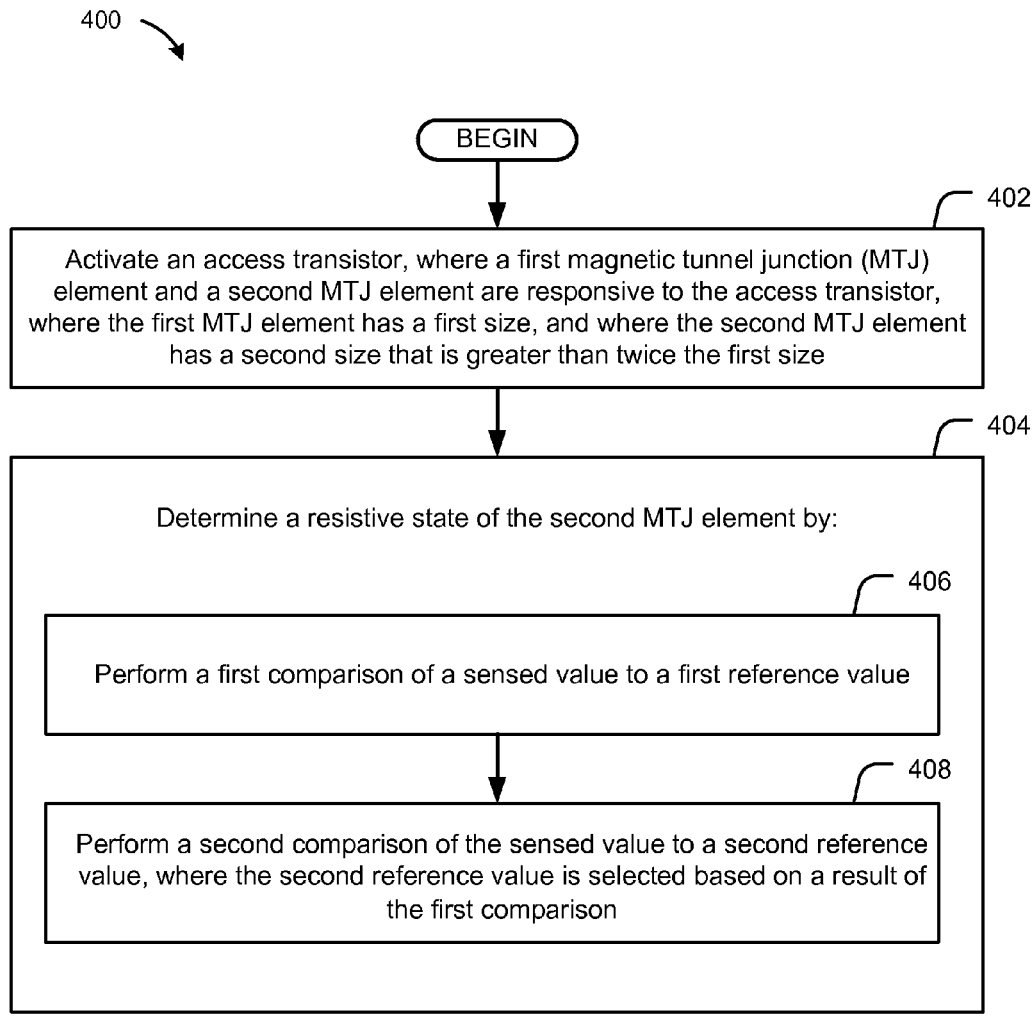
FIG. 4 is a flow chart that illustrates a particular aspect of a method of operating a device.

Referring to FIG. 4, a flow chart that illustrates a particular aspect of a method of operating a device is shown and generally designated 400. The method 400 may be performed at a device that includes an access transistor, a first magnetic tunnel junction (MTJ) element, and a second MTJ element. The method 400 may, for example, be performed at the device 100 of FIG. 1, memory devices (e.g., the memory devices 203, 205, 207, or 209) that form part of the memory array 200 of FIG. 2, the system 300 of FIG. 3A, or a combination thereof.

The method 400 may include activating an access transistor, where a first magnetic tunnel junction (MTJ) element and a second MTJ element are responsive to the access transistor at 402. In one example, the first MTJ element has a first size, and the second MTJ element has a second size that is greater than twice the first size. For example, the access transistor may correspond to the access transistor 106, the first MTJ element may correspond to the first MTJ element 102, and the second MTJ element may correspond to the second MTJ element 104. The first MTJ element, the second MTJ element, and the access transistor may form a multi-bit STT-MRAM memory cell.

Activating the access transistor may include providing a signal (e.g., voltage) via a word line (e.g., the word line 108 of FIG. 1 or the word lines 210 and 212 of FIG. 2) to a gate of the access transistor 106 that may indicate a read request corresponding to the second MTJ element. Based on the signal from the word line, the access transistor may selectively couple the first MTJ element to the second MTJ element. As part of the read request, a particular current associated with the second MTJ element may be applied at a bit line coupled to the first MTJ element or at a source line coupled to the second MTJ element and a current value associated with the second MTJ element may be sensed.

The method 400 also includes determining a resistive state of the second MTJ element at 404. For example, the resistive states (e.g., the logical states) of the first and second MTJ elements of a two-bit STT-MRAM memory cell may be based on one or more combinations of a parallel state or anti-parallel state of the first MTJ element with a parallel state or anti-parallel state of the second MTJ element. For example, a parallel state of an MTJ element may correspond to the MTJ element having a "free layer" magnetic orientation that is parallel with a "fixed layer" magnetic orientation. An anti-parallel state of an MTJ element may correspond to the MTJ element having the "free layer" magnetic orientation that is not parallel with the "fixed layer" magnetic orientation. The resistive states (e.g., the logical states) of the first and second MTJ elements may include parallel state and anti-parallel state combinations that correspond to four logic states (e.g., the logic states "00", "01", "10", and "11").

As part of determining the resistive state of the second MTJ element, at 404, the method 400 also includes performing a first comparison of a sensed value to a first reference value, at 406. For example, the first comparison may utilize a sensed value associated with the second MTJ element and may compare the sensed value to the first reference value. The first reference value may be a first reference level associated with the second MTJ element.

As part of determining the resistive state of the second MTJ element, at 404, the method 400 also includes performing a second comparison of the sensed value to a second reference value, the second reference value selected based on a result of the first comparison, at 408. For example, if the result of the first comparison (e.g., a comparison result of "1") indicates that the sensed value is greater than the first reference level (e.g., the first reference level associated with the second MTJ element), then a second reference level (e.g., a second reference level associated with the second MTJ element) may be used as a reference level to which the sensed value is compared during the second comparison.

A result of the second comparison that indicates the sensed value is greater than the second reference level associated with the second MTJ element may indicate that the second MTJ element is associated with a particular logic state (e.g., logic state "11" corresponding to an anti-parallel state of the first MTJ element and an anti-parallel state of the second MTJ element). Other possible resistive states (e.g., logic states) of the second MTJ element may be determined based on different results from the first and second comparisons, as further described with reference to FIGS. 5A, 5B, 5C, and 5D.

Although the method 400 of FIG. 4 has been described with regard to FIG. 1, the method 400 may also be performed by the memory array of FIG. 2. For example, the method 400 may be performed, initiated, or controlled by another device that includes first and second MTJ elements. Examples of devices that may include first and second MTJ elements include a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 400 of FIG. 4 can be performed by a memory controller or processor that executes instructions, as described with respect to FIG. 3A or 6. The instructions may provide options for reading the second MTJ element. The instructions may also indicate reference levels to be used in determining the reference state of the second MTJ element, as further described with reference to FIGS. 5A, 5B, 5C, and 5D.

Figure 5A:
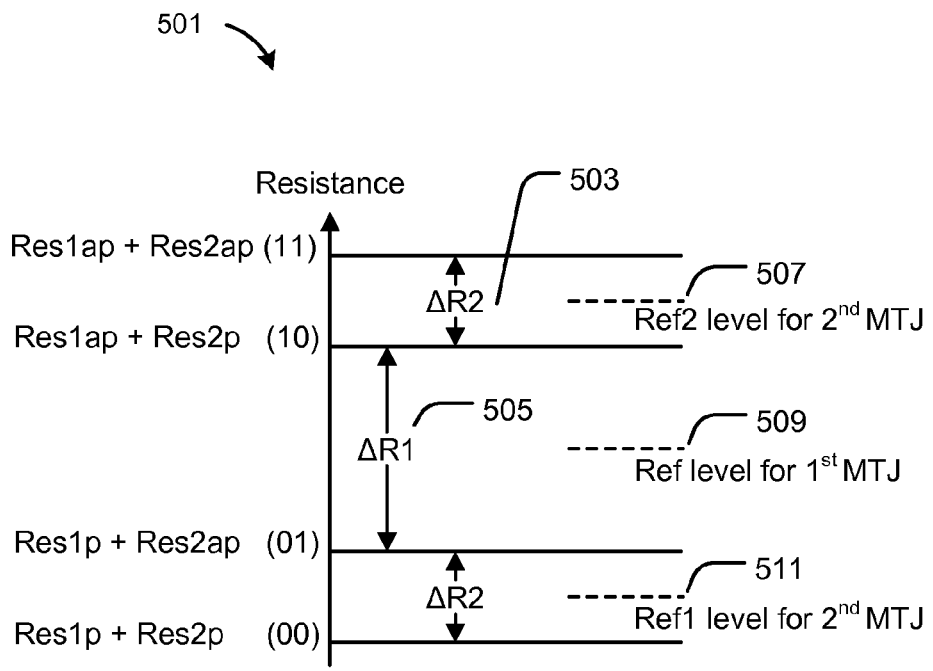
FIG. 5A is a chart that illustrates a particular mapping of logic states to parallel and anti-parallel states of a device.

Referring to FIG. 5A, details of a particular mapping of logic states to parallel and anti-parallel states of a device are shown and generally designated by a chart 501. The chart 501 shows the resistive states of first and second MTJ elements (e.g., the first and second MTJ elements 102, 104 of FIG. 1 or the first and second MTJ elements 230, 232, 250, 252, 270, 272, 290, 292 of FIG. 2). For example, a two-bit STT-MRAM memory cell that includes a first MTJ element and a second MTJ element may be programmed to a series resistance that indicates one of four logic states (e.g., the logic states "00", "01", "10", and "11").

The chart 501 shows a particular mapping of the logic states to the parallel and anti-parallel states (e.g., Res1p, Res2p, Res1ap, and Res2ap) of the first and second MTJ elements. In the example of FIG. 5A, a resistive state corresponding to the logic state "00" may indicate a parallel state of the first MTJ element (e.g., Res1p) and a parallel state of the second MTJ element (e.g., Res2p). A resistive state corresponding to the logic state "01" may indicate a parallel state of the first MTJ element (e.g., Res1p) and an anti-parallel state of the second MTJ element (e.g., Res2ap). A resistive state corresponding to the logic state "10" may indicate an anti-parallel state of the first MTJ element (e.g., Res1ap) and a parallel state of the second MTJ element (e.g., Res2p). A resistive state corresponding to the logic state "11" may indicate an anti-parallel state of the first MTJ element (e.g., Res1ap) and an anti-parallel state of the second MTJ element (e.g., Res2ap).

Determining a resistive state for the first and second MTJ elements may include a comparison of a sensed value to one or more reference level values associated with the first and second MTJ elements. For example, the first MTJ element may be associated with a reference level 509 and the second MTJ element may be associated with a first reference level 511 and a second reference level 507. The single reference level 509 associated with the first MTJ element (e.g., the first MTJ element 102 of FIG. 1) may be greater than the first reference level 511 associated with the second MTJ element (e.g., the second MTJ element 104 of FIG. 1) and less than the second reference level 507 associated with the second MTJ element.

The first and second MTJ elements may have different operating parameters (e.g., as a result of the second MTJ element having a size that is greater than twice the size of the first MTJ element). For example, a first read margin ($\Delta R1$) 505 may be associated with the first MTJ element (e.g., the first MTJ element 102 of FIG. 1) and a second read margin ($\Delta R2$) 503 may be associated with the second MTJ element (e.g., the second MTJ element 104 of FIG. 1). The $\Delta R2$ of the second MTJ element may be less than the $\Delta R1$ of the first MTJ element.

Differences in read margin for the first and second MTJ elements may make one MTJ element more tailored to a particular memory use than the other MTJ element. For example, the larger $\Delta R1$ of the first MTJ element may provide a larger margin of error for read operations that are fast or frequent (e.g., the fast and/or frequent read operation of a cache memory). The smaller $\Delta R2$ of the second MTJ element may be more conducive to read operations that are slower or infrequent (e.g., the slower and fewer read operations of a long term storage memory).

The resistive states of the first and second MTJ elements may be determined by the comparison of sensed values of the first and second MTJ elements to reference values associated with the first and second MTJ elements. For example, during a read operation of the first MTJ element (e.g., the first MTJ element 102 of FIG. 1), a sensed value may be compared to the reference level 509 associated with the first MTJ element. If the comparison indicates that the sensed value is greater than the reference level 509, then the first MTJ element has the anti-parallel state (e.g., Res1ap), which indicates that the first MTJ element stores a logic "1" bit. If the comparison indicates that the sensed value is less than the reference level 509, then the first MTJ element has the parallel state (e.g., Res1p), which indicates that the first MTJ element stores a logic "0" bit.

Determining the resistive state (e.g., a logic state) of the second MTJ element (e.g., the second MTJ element 104 of FIG. 1) may utilize a dual-comparison method that may use two or more of the reference levels (e.g., the reference level values 507, 509, and 511) associated with the first and second MTJ elements.

Figure 5B:
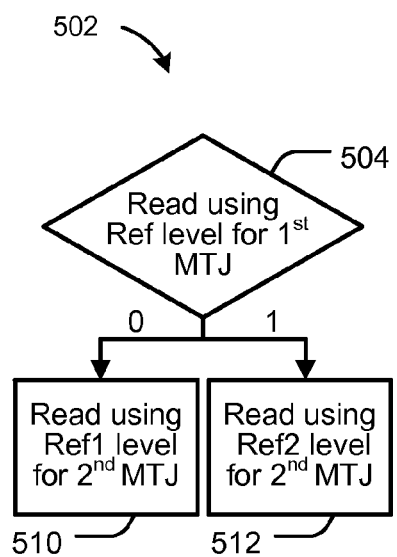
FIG. 5B is a diagram that illustrates a method of reading a device, such as the device described with reference to FIG. 5A.

Referring to FIG. 5B, a method of reading a device is shown and generally designated 502. For example, the method 502 may be performed to determine a logic state associated with the device described with reference to FIG. 5A. Reading data from a second MTJ element (e.g., the second MTJ element 104 of FIG. 1 or 232, 252, 272, 292 of FIG. 2) may utilize a dual-comparison method to determine the logic state of the second MTJ element. The dual-comparison method may include utilizing a sensed value associated with the second MTJ element to perform a first comparison of the sensed value to a first reference value and, based on the result of the first comparison, selecting a second reference value to perform a second comparison of the sensed value to the second reference value.

The dual-comparison method may include a first option for reading from the second MTJ element. For example, in the first option, a reference level associated with the first MTJ element (e.g., the reference level 509 of FIG. 5A) may be used as the reference level that the sensed value is compared to as part of the first comparison performed at 504.

If the result of the first comparison (e.g., a result of "1") indicates that the sensed value is greater than the reference level (e.g., the reference level 509 of FIG. 5A) then a second reference level associated with the second MTJ element (e.g., the Ref2 level 507 of FIG. 5A) may be used as a reference level that the sensed value is compared to during a second comparison performed, at 512. If the second comparison indicates the sensed value is greater than the second reference level associated with the second MTJ element (e.g., the Ref2 level 507 of FIG. 5A), then a determination may be made that the second MTJ element stores a logic "1" bit. If the second comparison indicates the sensed value is less than the second reference level associated with the second MTJ element (e.g., the Ref2 level 507 of FIG. 5A), then a determination may be made that the second MTJ element stores a logic "0" bit.

If the result of the first comparison (e.g., a result of "0") indicates that the sensed value is less than the reference level (e.g., the reference level 509 of FIG. 5A) then a first reference level associated with the second MTJ element (e.g., the Ref1 level 511 of FIG. 5A) may be used as a reference level that the sensed value is compared to during a second comparison performed at 510. A result of the second comparison indicating the sensed value is greater than the first reference level associated with the second MTJ element (e.g., the Ref1 level 511 of FIG. 5A) may indicate the second MTJ element stores a logic "1" bit. A result of the second comparison indicating the sensed value is less than the first reference level associated with the second MTJ element (e.g., the Ref1 level 511 of FIG. 5A) may indicate the second MTJ element stores a logic "0" bit.

It will be appreciated that FIG. 5A illustrates a particular mapping of logic states (e.g., "00", "01", "10", and "11") to the parallel and anti-parallel states (e.g., Res1p, Res2p, Res1ap, and Res2ap) of the first and second MTJ elements. The particular mapping shown in FIG. 5A represents a case where, for both first and second MTJ elements, a parallel state corresponds to a logic "0" state and an anti-parallel state corresponds to a logic "1" state. Other mappings of the logic states to the parallel and anti-parallel states of the first and second MTJ elements may be implemented. For example, in another particular mapping a logic state indicated by a resistive state of the second MTJ element may depend on a resistive state of the first MTJ element, as described further with reference to FIG. 5C and FIG. 5D.

Figure 5C:
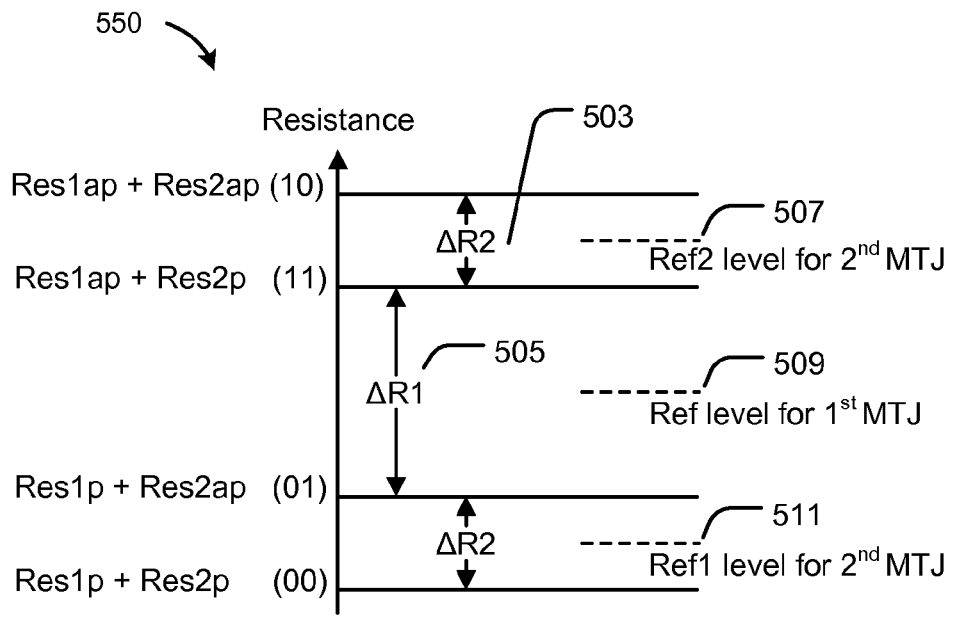
FIG. 5C is a chart that illustrates another mapping of logic states to parallel and anti-parallel states of a device.

Referring to FIG. 5C, details of another mapping of logic states to parallel and anti-parallel states of a device are shown and generally designated by a chart 550. The chart 550 shows the resistive states of first and second MTJ elements (e.g., the first and second MTJ elements 102, 104 of FIG. 1 or the first and second MTJ elements 230, 232, 250, 252, 270, 272, 290, 292 of FIG. 2). For example, a two-bit STT-MRAM memory cell that includes a first MTJ element and a second MTJ element may be programmed to a series resistance that indicates one of four logic states (e.g., the logic states "00", "01", "10", and "11"). In FIG. 5C, the logic state "10" corresponds to a greater series resistance than the logic state "11" (instead of the logic state "10" corresponding to a lower series resistance than the logic state "11", as in the example of FIG. 5A).

For example, a resistive state corresponding to the logic state "00" may indicate a parallel state of the first MTJ element (e.g., Res1p) and a parallel state of the second MTJ element (e.g., Res2p). A resistive state corresponding to the logic state "01" may indicate a parallel state of the first MTJ element (e.g., Res1p) and an anti-parallel state of the second MTJ element (e.g., Res2ap). A resistive state corresponding to the logic state "11" may indicate an anti-parallel state of the first MTJ element (e.g., Res1ap) and a parallel state of the second MTJ element (e.g., Res2p). A resistive state corresponding to the logic state "10" may indicate an anti-parallel state of the first MTJ element (e.g., Res1ap) and an anti-parallel state of the second MTJ element (e.g., Res2ap). Thus, in FIG. 5C, the logic states "10" and "11" correspond to different series resistances and different parallel and anti-parallel states as compared to the example of FIG. 5A.

Figure 5D:
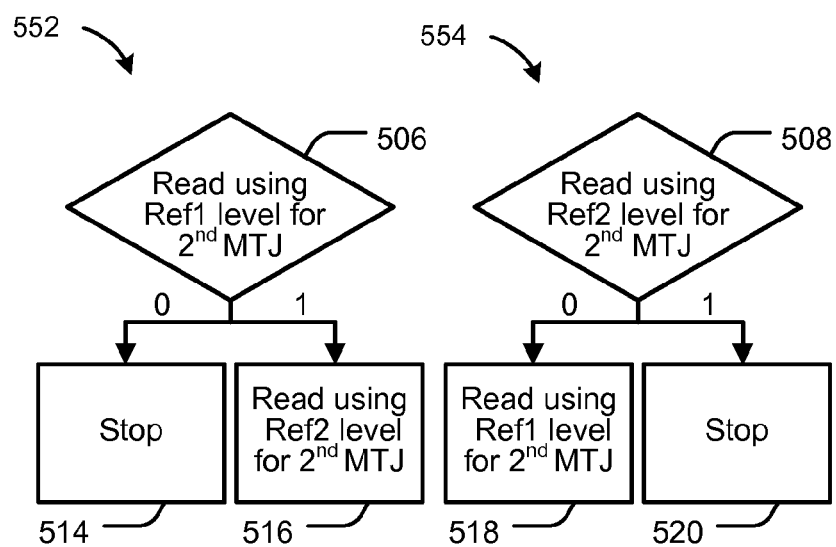
FIG. 5D is a diagram that illustrates methods of reading a device, such as the device described with reference to FIG. 5C.

Referring to FIG. 5D, methods of reading a second MTJ element of a device are shown and generally designated 552 and 554, respectively. For example, the methods 552 and 554 may be performed to determine a logic state associated with the device described with reference to FIG. 5C. The dual-comparison method may include a second option for reading from the second MTJ element. For example, during the second option, a first comparison is performed at 506. As part of the first comparison 506, the sensed value may be compared to the first reference level associated with the second MTJ element (e.g., the reference level 511 of FIG. 5C).

If the result of the first comparison (e.g., a result of "1") indicates that the sensed value is greater than the reference level (e.g., the reference level 511 of FIG. 5C) then the second reference level associated with the second MTJ element (e.g., the Ref2 level 507 of FIG. 5C) may be used as a reference level that the sensed value is compared to during a second comparison performed at 516. A result of the second comparison indicating the sensed value is greater than the second reference level associated with the second MTJ element (e.g., the Ref2 level 507 of FIG. 5C) may indicate the second MTJ element stores a logic "0" bit. A result of the second comparison indicating the sensed value is less than the second reference level associated with the second MTJ element (e.g., the Ref2 level 507 of FIG. 5C) may indicate the second MTJ element stores a logic "1" bit.

If the result of the first comparison (e.g., a result of "0") indicates that the sensed value is less than the reference level (e.g., the reference level 511 of FIG. 5C) a second comparison is not performed, the method ends at 514, and the result may indicate the second MTJ element stores a logic "0" bit.

The dual-comparison method may include a third option for reading from the second MTJ element. For example, with the third option, a first comparison is performed at 508. As part of the first comparison 508, the sensed value may be compared to the second reference level associated with the second MTJ element (e.g., the reference level 507 of FIG. 5C).

If the result of the first comparison (e.g., a result of "0") indicates that the sensed value is less than the reference level (e.g., the reference level 507 of FIG. 5C) then the first reference level associated with the second MTJ element (e.g., the Ref1 level 511 of FIG. 5C) may be used as a reference level that the sensed value is compared to during a second comparison performed at 518. A result of the second comparison indicating the sensed value is greater than the first reference level associated with the second MTJ element (e.g., the Ref1 level 511 of FIG. 5C) may indicate the second MTJ element stores a logic "1" bit. A result of the second comparison indicating the sensed value is less than the first reference level associated with the second MTJ element (e.g., the Ref1 level 511 of FIG. 5C) may indicate the second MTJ element stores a logic "0" bit.

If the result of the first comparison (e.g., a result of "1") indicates that the sensed value is greater than the reference level (e.g., the reference level 507 of FIG. 5C) a second comparison is not performed, the method ends at 520, and the result may indicate the second MTJ element stores a logic "0" bit.

The examples of FIGS. 5A and 5B illustrate a first option for reading the second MTJ element using two read operations and a particular mapping of logic states to parallel and anti-parallel states. The examples of FIGS. 5C and 5D illustrate second and third options for reading the second MTJ element using one or two read operations and another mapping of logic states to parallel and anti-parallel states.

It will be appreciated that FIGS. 5A and 5B may represent a case of logic mapping that involves fewer processing steps in certain implementations as compared to the examples of FIGS. 5C and 5D, but which may use two read operations of the second MTJ element. To illustrate, in the case of FIGS. 5A and 5B, for both first and second MTJ elements, a parallel state corresponds to a logic "0" state and an anti-parallel state corresponds to a logic "1" state. In the case of FIGS. 5C and 5D, for the second MTJ element, the parallel state may correspond to either a logic "0" state or a logic "1" state (depending on whether the first MTJ element has a parallel state or anti-parallel state, respectively). Further, in FIGS. 5C and 5D, the anti-parallel of the second MTJ element may indicate a logic "1" state or a logic "0" state depending on whether the first MTJ element has a parallel state or an anti-parallel state, respectively. In the case of FIGS. 5C and 5D, more processing operations may be utilized during a write operation to the second MTJ element to account for the alternate mapping of the second MTJ element as compared to the logic mapping in the case of FIGS. 5A and 5B. For example, writing a logic "0" state or a logic "1" state to the second MTJ element using the mapping of FIG. 5C may include performing a sense operation to determine the state of the first MTJ element (and to determine whether the second MTJ element should be programmed to a parallel state or to an anti-parallel state based on the state of the first MTJ element). The device described with reference to FIG. 5C may include circuitry configured to sense the state of the first MTJ element in response to initiation of a write operation to the second MTJ element. The device described with reference to FIG. 5C may further include circuitry configured to provide a signal to write circuitry indicating the state of the first MTJ element to enable the write circuitry to determine whether to program the second MTJ element to a parallel state or to an anti-parallel state.

In some cases, a device in accordance with FIGS. 5C and 5D may use fewer read operations (on average) than the logic mapping associated with FIGS. 5A and 5B (e.g., an average of 1.5 read operations). Thus, FIGS. 5A and 5B illustrate a case that may be advantageous where write operation speed (for the second MTJ element) is to be increased (e.g., because a parallel or anti-parallel state to be programmed to the second MTJ element may not depend on a state associated with the first MTJ element). The examples of FIGS. 5C and 5D illustrate a case that may be advantageous where read operation speed (for the second MTJ element) is to be increased (e.g., because a state of the second MTJ element can be determined using a single read operation in some cases, as illustrated in FIG. 5D). It should be appreciated that a device may use the examples of FIGS. 5A and 5B alternatively or in addition to the examples of FIGS. 5C and 5D. For example, in some implementations, a device may dynamically alternate between operating according to the examples of FIGS. 5A and 5B (e.g., to increase write operation speed) and operating according to the examples of FIGS. 5C and 5D (e.g., to increase read operation speed).

The operations described with reference to FIGS. 5A, 5B, 5C, and 5D may be performed by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the operations described with reference to FIGS. 5A, 5B, 5C, and 5D can be performed by a processor that executes instructions, as described with respect to FIG. 3A and FIG. 6.

Figure 6:
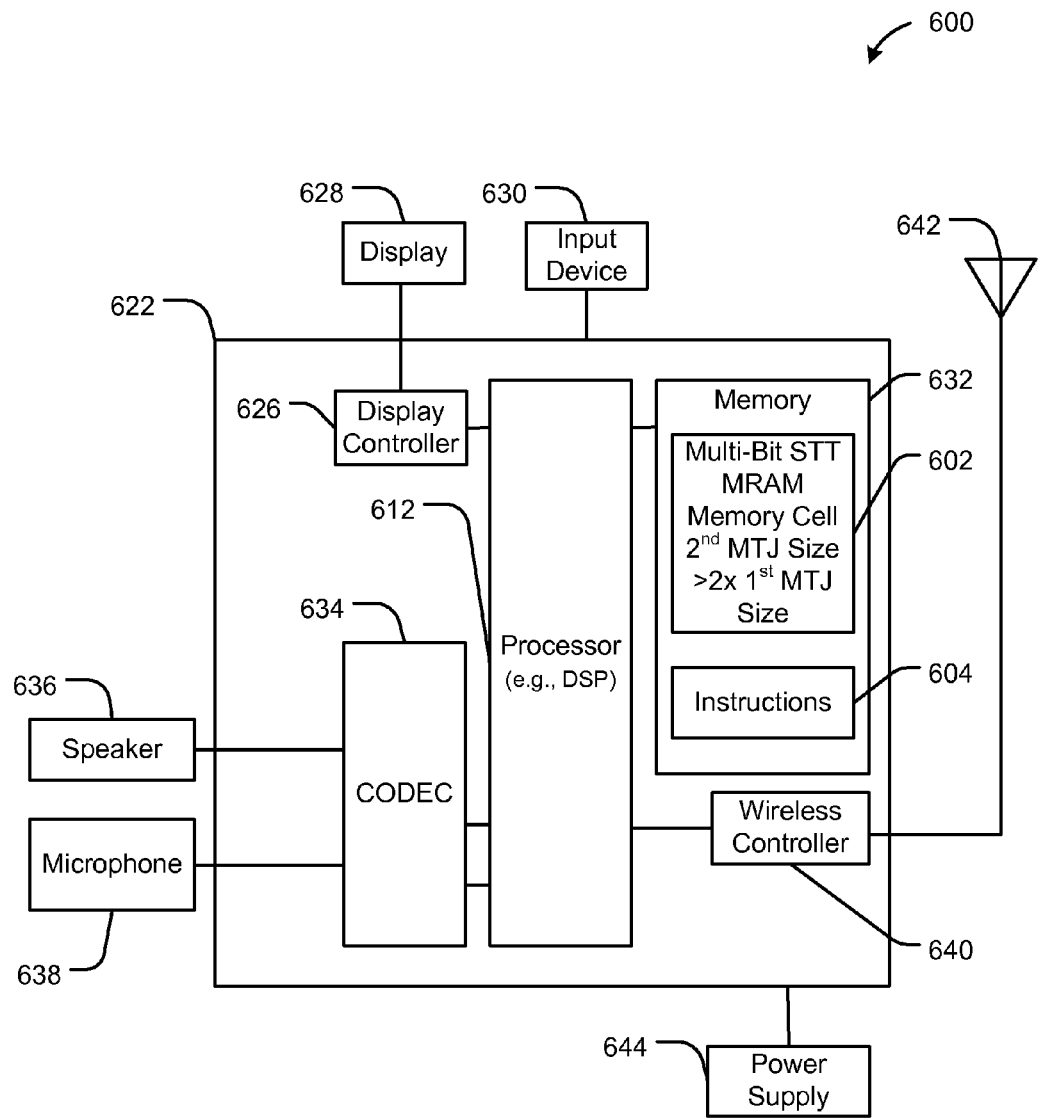
FIG. 6 is a block diagram that illustrates a particular aspect of a wireless communication device.

Referring to FIG. 6, a block diagram of a particular aspect of a wireless communication device is depicted and generally designated 600. The device 600 includes a processor 612 (e.g., a digital signal processor (DSP)), coupled to a memory 632. The processor 612 may be any processor or electronic device capable of processing instructions. The memory 632 includes one or more of a multi-bit STT-MRAM memory cell 602 with a second MTJ element and a first MTJ element as part of memory sub-arrays of a memory array (e.g., the memory array 318 of FIG. 3). In an illustrative example, the multi-bit STT-MRAM memory cell 602 may correspond to the device 100 of FIG. 1. In another illustrative example, the memory 632 may include an array of multi-bit STT-MRAM memory cells, such as the multi-bit STT-MRAM memory cells 203, 205, 207, and 209 of FIG. 2. In another illustrative example, the memory 632 may include the memory array 318 of FIGS. 3A and 3B. The memory 632 may operate according to the methods of FIG. 3 or FIG. 4B and may operate according to the memory uses described previously.

The memory 632 may be a non-transient computer readable medium of a device that includes an access transistor (e.g., access transistor 106 of FIG. 1), a first MTJ element (e.g., the first MTJ element 102 of FIG. 1), and a second MTJ element (e.g., the second MTJ element 104 of FIG. 1). The memory 632 stores computer-executable instructions 604 that are executable by the processor 612 to cause the processor 612 to activate the access transistor. The access transistor is coupled between the first MTJ element and the second MTJ element. The processor 612 may further determine a resistive state of the first MTJ element and the second MTJ element.

The computer-executable instructions 604 may further include instructions executable by the processor 612 to cause the processor 612 to determine the resistive state of the second MTJ element by performing a first comparison of a sensed value to a first reference value (e.g., any one of reference levels 507, 509, 511 of FIG. 5A or FIG. 5C) and by performing a second comparison of the sensed value to a second reference value (e.g., any one of reference levels 507, 509, 511 of FIG. 5A or FIG. 5C), the second reference value selected based on a result of the first comparison. For example, the second reference value may be selected based on the first comparison indicating whether the sensed value is greater or less than the reference value used as part of the first comparison. The memory 632 may be integrated within a device, such as a mobile phone, a tablet, a set top box, a music player, a video player, an entertainment unit, a navigation device, a communications device, a personal digital assistant (PDA), a fixed location data unit, or a computer, as illustrative examples.

FIG. 6 also shows a display controller 626 that is coupled to the digital signal processor 612 and to a display 628. A coder/decoder (CODEC) 634 can also be coupled to the digital signal processor 612. A speaker 636 and a microphone 638 can be coupled to the CODEC 634.

FIG. 6 also indicates that a wireless controller 640 can be coupled to the digital signal processor 612 and to an antenna 642. In a particular aspect, the processor 612, the display controller 626, the memory 632, the CODEC 634, and the wireless controller 640 are included in a system-in-package or system-on-chip device 622. In a particular aspect, an input device 630 and a power supply 644 are coupled to the system-on-chip device 622. Moreover, in a particular aspect, as illustrated in FIG. 6, the display 628, the input device 630, the speaker 636, the microphone 638, the antenna 642, and the power supply 644 are external to the system-on-chip device 622. However, each of the display 628, the input device 630, the speaker 636, the microphone 638, the antenna 642, and the power supply 644 can be coupled to a component of the system-on-chip device 622, such as to an interface or to a controller.

A system may include first means for storing a first magnetic state, such as the first MTJ element 102 of FIG. 1, one or more other devices or circuits configured to store the first resistive state, or any combination thereof. The first means for storing a first magnetic state may have a first size. The system may also include second means for storing a second magnetic state, such as the second MTJ element 104 of FIG. 1, one or more other devices or circuits configured to store the second resistive state, or any combination thereof. The second means for storing a second magnetic state may have a second size that is greater than twice the first size. The system may also include means for coupling the first means for storing and the second means for storing, such as the access transistor 106 of FIG. 1, one or more other devices or circuits configured to couple the first means for storing and the second means for storing, or any combination thereof. The means for coupling may be coupled to a word line. The means for coupling, the first means for storing a first magnetic state and the second means for storing a second magnetic state may form a multi-bit STT-MRAM memory cell, such as the device 100 of FIG. 1.

The system may also include a bit line coupled to the first means for storing and a source line coupled to the second means for storing. The means for coupling may be configured to couple the first means for storing to the second means for storing in response to a word line signal. The system may also include a memory array that includes the first means for storing, the second means for storing, and the means for coupling (e.g., the memory array 200 that includes the memory devices 203, 205, 207, or 209 of FIG. 2). The system may utilize other devices or circuitry peripheral the memory array that may be configured to activate the means for coupling, the first means for storing, the second means for storing, and determine the resistive state of the first and second means for storing.

An apparatus may include a first MTJ sub-array (e.g., the high speed sub-array 312 of FIG. 3A) formed by a plurality of first MTJ elements of a memory array, such as the plurality of first MTJ elements (e.g., the plurality of striped boxes of FIG. 3B) that includes the first MTJ element 320 of FIG. 3B. The apparatus may also include a second MTJ sub-array (e.g., the high data retention sub-array 314 of FIG. 3A) formed by a plurality of second MTJ elements of the memory array, such as the plurality of second MTJ elements (e.g., the plurality of solid black boxes of FIG. 3B) that includes the second MTJ element 322 of FIG. 3B. The first MTJ sub-array may be configured to operate based on a first set of parameters for a first memory use and the second MTJ sub-array may be configured to operate based on a second set of parameters for a second memory use that is different from the first memory use.

The apparatus may also include a memory controller, such as the memory controller 304 of FIG. 3A. The memory controller may be configured to address each of the plurality of first MTJ elements (e.g., the plurality of striped boxes of FIG. 3B) of the first MTJ sub-array (e.g., the high speed sub-array 312 of FIG. 3A) and each of the plurality of second MTJ elements (e.g., the plurality of solid black boxes of FIG. 3B) of the second MTJ sub-array (e.g., the high data retention sub-array 314 of FIG. 3A). The apparatus may utilize other devices or circuitry peripheral to the memory controller, the first MTJ sub-array, and the second MTJ sub-array that may be configured to activate the first and second MTJ sub-arrays.

Those of skill would further appreciate that the various illustrative logical blocks, configurations, modules, circuits, and algorithm steps described in connection with the aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be performed directly in hardware, in a software module executed by a processor, or in a combination of the two. A software module may reside in magnetoresistive random access memory (MRAM), random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A device comprising:
   a first magnetic tunnel junction (MTJ) element having a first read margin;
   a second MTJ element having a second read margin, the first read margin greater than twice the second read margin;
   an access transistor coupled between the first MTJ element and the second MTJ element, wherein a gate of the access transistor is coupled to a word line, and wherein the first MTJ element, the second MTJ element, and the access transistor form a multi-bit spin torque transfer magnetoresistive random access memory (STT-MRAM) memory cell; and
   circuitry configured to compare a sensed value of the STT-MRAM memory cell to a second value, the second value based on a comparison of the sensed value to a first value.

2. The device of claim 1, further comprising a bit line coupled to the first MTJ element and a source line coupled to the second MTJ element, wherein the circuitry is further configured to determine a resistive state of the second MTJ element based on a relation of the sensed value to the second value.

3. The device of claim 1, wherein the access transistor is configured to couple the first MTJ element to the second MTJ element responsive to a word line signal.

4. The device of claim 1, wherein the access transistor is an n-type metal-oxide-semiconductor (NMOS) transistor.

5. The device of claim 1, wherein the access transistor is a p-type metal-oxide-semiconductor (PMOS) transistor.

6. The device of claim 1, wherein the first MTJ element has a first data retention time and the second MTJ element has a second data retention time that is longer than the first data retention time.

7. The device of claim 1, wherein the first MTJ element has a first size and the second MTJ element has a second size that is greater than twice the first size.

8. The device of claim 1, wherein the second MTJ element is associated with a first reference levels indicated by the first value and a second reference level indicated by the second value, and wherein the first MTJ element is associated with one reference level.

9. The device of claim 1, further comprising an apparatus selected from a mobile phone, a tablet, a set top box, a music player, a video player, an entertainment unit, a navigation device, a communications device, a personal digital assistant (PDA), a fixed location data unit, and a computer, into which the first MTJ element, the second MTJ element, and the access transistor are integrated.

10. A method of operation of a device that includes an access transistor, a first magnetic tunnel junction (MTJ) element, and a second MTJ element, the method comprising:
   activating the access transistor, wherein the first MTJ element and the second MTJ element are responsive to the access transistor, wherein the first MTJ element has a first size, and wherein the second MTJ element has a second size that is greater than twice the first size; and
   determining a resistive state of the second MTJ element by:
      performing a first comparison of a sensed value to a first reference value; and
      performing a second comparison of the sensed value to a second reference value, wherein the second reference value is based on a result of the first comparison.

11. The method of claim 10, further comprising applying a particular current at a bit line coupled to the first MTJ element, wherein the access transistor is activated via a word line signal applied to a gate of the access transistor, and wherein applying the particular current occurs prior to the determining of the resistive state.

12. The method of claim 10, wherein the first MTJ element, the second MTJ element, and the access transistor form a multi-bit spin torque transfer magnetoresistive random access memory (STT-MRAM) memory cell.

13. The method of claim 12, wherein a resistive state of the first MTJ element and the resistive state of the second MTJ element are based on one or more combinations of a parallel state or anti-parallel state of the first MTJ element with a parallel state or anti-parallel state of the second MTJ element.

14. An apparatus comprising:
   first means for storing a first magnetic state, wherein the first means for storing has a first size;
   second means for storing a second magnetic state, wherein the second means for storing has a second size that is greater than twice the first size;
   means for coupling the first means for storing and the second means for storing, wherein the means for coupling is coupled to a word line, and wherein the first means for storing, the second means for storing, and the means for coupling form a multi-bit spin torque transfer magnetoresistive random access memory (STT-MRAM) memory cell; and
   means for comparing a sensed value of the STT-MRAM memory cell to a second value, the second value based on a comparison of the sensed value to a first value.

15. The apparatus of claim 14, further comprising a bit line coupled to the first means for storing and a source line coupled to the second means for storing, the means for coupling configured to couple the first means for storing to the second means for storing in response to a word line signal, the first value indicating a first reference level associated with the second means for storing, the second value indicating a second reference level associated with the second means for storing, and the means for comparing further configured to determine a resistive state of the second means for storing based on a relation of the sensed value to the second value.

16. An apparatus comprising:
   a first magnetic tunnel junction (MTJ) sub-array formed by a plurality of first MTJ elements of a memory array;
   a second MTJ sub-array formed by a plurality of second MTJ elements of the memory array, wherein the first MTJ sub-array is configured to operate based on a first set of parameters for a first memory use and the second MTJ sub-array is configured to operate based on a second set of parameters for a second memory use that is different from the first memory use; and circuitry configured to compare a sensed value associated with an MTJ element of the plurality of second MTJ elements to a second value, the second value based on a comparison of the sensed value to a first value.

17. The apparatus of claim 16, wherein the circuitry is further configured to determine a resistive state of the MTJ element based on a relation of the sensed value to the second value, wherein each MTJ element of the plurality of first MTJ elements has a first size, and wherein each MTJ element of the plurality of second MTJ elements has a second size that is greater than twice the first size.

18. The apparatus of claim 16, further comprising a memory controller configured to address each of the plurality of first MTJ elements of the first MTJ sub-array and each of the plurality of second MTJ elements of the second MTJ sub-array.

19. The apparatus of claim 16, further comprising a memory controller configured to store data at the first MTJ sub-array or at the second MTJ sub-array based on a priority indicator received at the memory controller from a central processing unit (CPU), the priority indicator indicating a priority level associated with the data to be stored.

20. A non-transitory computer-readable medium storing instructions, which when executed by a processor of an apparatus, cause the processor to perform operations comprising:
    activating an aces transistor, wherein a first MTJ element and a second MTJ element at the apparatus are responsive to the access transistor, wherein the first MTJ element has a first size, and wherein the second MTJ element has a second size that is greater than twice the first size; and
    determining a resistive state of the second MTJ element by:
        performing a first comparison of a sensed value to a first reference value; and
        performing a second comparison of the sensed value to a second reference value, wherein the second reference value is based on a result of the first comparison.

21. The non-transitory computer-readable medium of claim 20, wherein the operations further comprise storing data at the first MTJ element or at the second MTJ element based on a priority indicator that indicates a priority level associated with the data to be stored.

22. The apparatus of claim 16, wherein the second MTJ sub-array is configured to store data values that are duplicate values of corresponding data that is stored at the first MTJ sub-array.

23. The apparatus of claim 16, wherein the first MTJ sub-array is configured to operate as a data cache.

24. The apparatus of claim 16, wherein the second MTJ sub-array is configured to operate as a temporary storage array for the first MTJ sub-array.

25. The apparatus of claim 16, wherein the second MTJ sub-array is configured to store data that is used as part of a sleep-mode operation of an electronic device.

26. The apparatus of claim 16, wherein the second MTJ sub-array is configured to store data that is used as part of an initialization operation of an electronic device.

27. The apparatus of claim 16, wherein the first set of parameters is based on physical characteristics of each of the plurality of first MTJ elements, and wherein the second set of parameters is based on physical characteristics of each of the plurality of second MTJ elements.

28. The apparatus of claim 27, wherein the physical characteristics of the first MTJ elements include a first size, and wherein the physical characteristics of the second MTJ elements include a second size that is greater than twice the first size.

29. The apparatus of claim 16, wherein the first MTJ sub-array and the second MTJ sub-array are integrated in at least one die.

30. The apparatus of claim 16, further comprising a device selected from a mobile phone, a tablet, a set top box, a music player, a video player, an entertainment unit, a navigation device, a communications device, a personal digital assistant (PDA), a fixed location data unit, and a computer, into which the first MTJ sub-array and the second MTJ sub-array are integrated.

* * * * *